METHOD OF FORMING A SMALL AREA JUNCTION SEMICONDUCTOR

Filed June 30, 1965 2 Sheets-Sheet 1

INVENTORS
Emery C. Wisman
Jack H. Abernathy

BY John G. Graham

ATTORNEY

METHOD OF FORMING A SMALL AREA JUNCTION SEMICONDUCTOR

Filed June 30, 1965 2 Sheets-Sheet 2

INVENTORS
Emery C. Wiseman
Jack H. Abernathy
BY John G. Graham
ATTORNEY

United States Patent Office 3,372,071

Patented Mar. 5, 1968

3,372,071
METHOD OF FORMING A SMALL AREA JUNCTION SEMICONDUCTOR

Emery C. Wisman, Richardson, and Jack H. Abernathy, Jr., Dallas, Tex., assignors to Texas Instruments Incorporated, Dallas, Tex., a corporation of Delaware Filed June 30, 1965, Ser. No. 468,371
4 Claims. (Cl. 148—187)

ABSTRACT OF THE DISCLOSURE

Disclosed is a method of making a semiconductor device by forming a first slot into which an impurity material may be diffused. Thereafter, the surface containing the impurity is coated with an oxide and then an aperture opened therein by coating the oxide with a photosensitive material and subjecting the photosensitive material to light through two successive masks having clear and opaque regions to form a pattern resulting from the intersection of opaque region on said successive masks, said intersection being removed to form an opening in the photosensitive material.

The present invention relates to semiconductor devices, and even more particularly to semiconductor devices having junctions of minimum area.

There is a continuing trend in the semiconductor field to demand devices operable at higher frequencies and capable of switching at higher speeds. In response to this demand, both diodes and transistors, for example, have been fabricated to incorporate design considerations directed toward obtaining these required operating characteristics. In particular, the physical dimensions of the diodes or the transistors must be made very small, especially the junction areas of these devices, in order to enable them to be operated at the high range of frequencies and the switching speeds demanded by modern-day requirements.

There is associated with the junctions of semiconductor devices such as diodes or transistors, a capacitive reactance which, at high frequencies, is of significant value to retard the utility of these devices. In addition, when a transistor, for example, is to be utilized as a switch, the storage of minority carriers in the base and collector regions slows down the switching operation. To overcome these objections and consequently provide higher frequency and faster switching devices, it is necessary to have as small operating junction areas as possible, thus minimizing the capacitive reactance and the minority carrier storage at this junction. In addition, the reduced junction area will correspondingly mean reduced leakage currents across the junction.

It is presently known in the semiconductor art to use photographic masking techniques in the fabrication of diffused junction transistors and diodes. For example, it is known to form an oxide layer on a surface of a silicon substrate and to apply a layer of photoresist material over the oxide layer. Thereafter a photographic mask having opaque areas corresponding to the apertures to be formed for diffusion purposes is then placed over the photoresist and a photographic exposure made. Regions of the photoresist not covered by opaque regions of the mask are thus rendered etch resistant while the masked regions can be dissolved to uncover the underlying regions of the oxide layer which may then be apertured by use of an etchant which does not affect the etch resistant portions of the photoresist coating. As a result of this photographic technique, junction diodes and transistors having relatively small diffusion apertures (and consequently small junction areas) may be produced.

When such apertures, however, are required to have areas of the order 0.1 sq. mil or less, the limits of resolution in the photographic mask can result in undesired irregularities in the shape of the apertures produced. In particular, when using a mask having rectangular opaque areas, apertures may be produced having corners rounded to such an extent that the production of reasonably rectangular apertures having areas of about 0.1 sq. mil or less is impracticable. Furthermore, the small dimensions involved present a formidable resolution problem in aligning the masks or patterns for the series of diffusion steps needed to produce the desired junctions. Hence, there will be a corresponding limitation upon the size of the junction areas that may be formed, thus limiting the frequency and the switching speed at which transistors and diodes may be operated.

With these difficulties in mind, it is an object of this invention to provide improved semiconductor devices, in particular transistors, having extremely small diffusion apertures which are well defined.

Another object is to provide a method of making small area diffused regions of transistors without requiring a high degree of criticality in the alignment of photomasks and patterns.

It is another object of this invention to provide transistor devices having extremely small operating junction areas useful for high frequency circuits, faster switching operation, and a minimum reverse leakage current across the junction.

These and other objects are accomplished by the process of this invention whereby an oxide layer is formed over a body of one conductivity type semiconductor material, a layer of photoresist applied over the oxide layer and a photomask defining a narrow line having a width corresponding approximately to the desired diameter of the diffusion aperture is placed in contact with the surface of the photoresist film. A photographic exposure and development is made, whereby regions of the photoresist not covered by the opaque region of the mask (in other words the narrow line) are thus rendered etch resistant. The photomask is then rotated so that another narrow strip of the photoresist is masked, the strip intersecting the original masked strip, preferably at a right angle, and the photoresist is again exposed and developed. As a consequence of these steps, all of the photoresist is rendered etch resistant except for an area corresponding to the intersection of the two lines or strips which is dissolved to uncover a corresponding area on the surface of the underlying oxide. Application of a chemical etchant then apertures the oxide layer solely in the portion corresponding to the area defined by the intersection of the narrow lines. A diffusion may now be made into this extremely small aperture to form a region of opposite type conductivity material within the original semiconductor body resulting in the production of an extremely small junction area. The sole limitation, therefore, upon the minimum area to which the junctions may be fabricated, using the process described in this invention, is the width to which each of the narrow lines may be formed.

The novel features believed characteristic of this invention are set forth in the appended claims. The invention itself, however, as well as other objects and advantages thereof, may best be understood by reference to the following detailed description of illustrative embodiments, read in conjunction with the appended claims and the accompanying drawings, wherein:

Reference is made to FIGURES 1–5, wherein there is illustrated a method for making a small geometry high-frequency junction transistor, at various stages of manufacture thereof, in accordance with the present invention. It is to be noted that these views are of only one segment or wafer of an entire semiconductor slice which comprises many such segments during manufacture and is separated into individual wafer only after the diffusions have been made and the contacts applied.

Figures 1, 2, 3, 4:
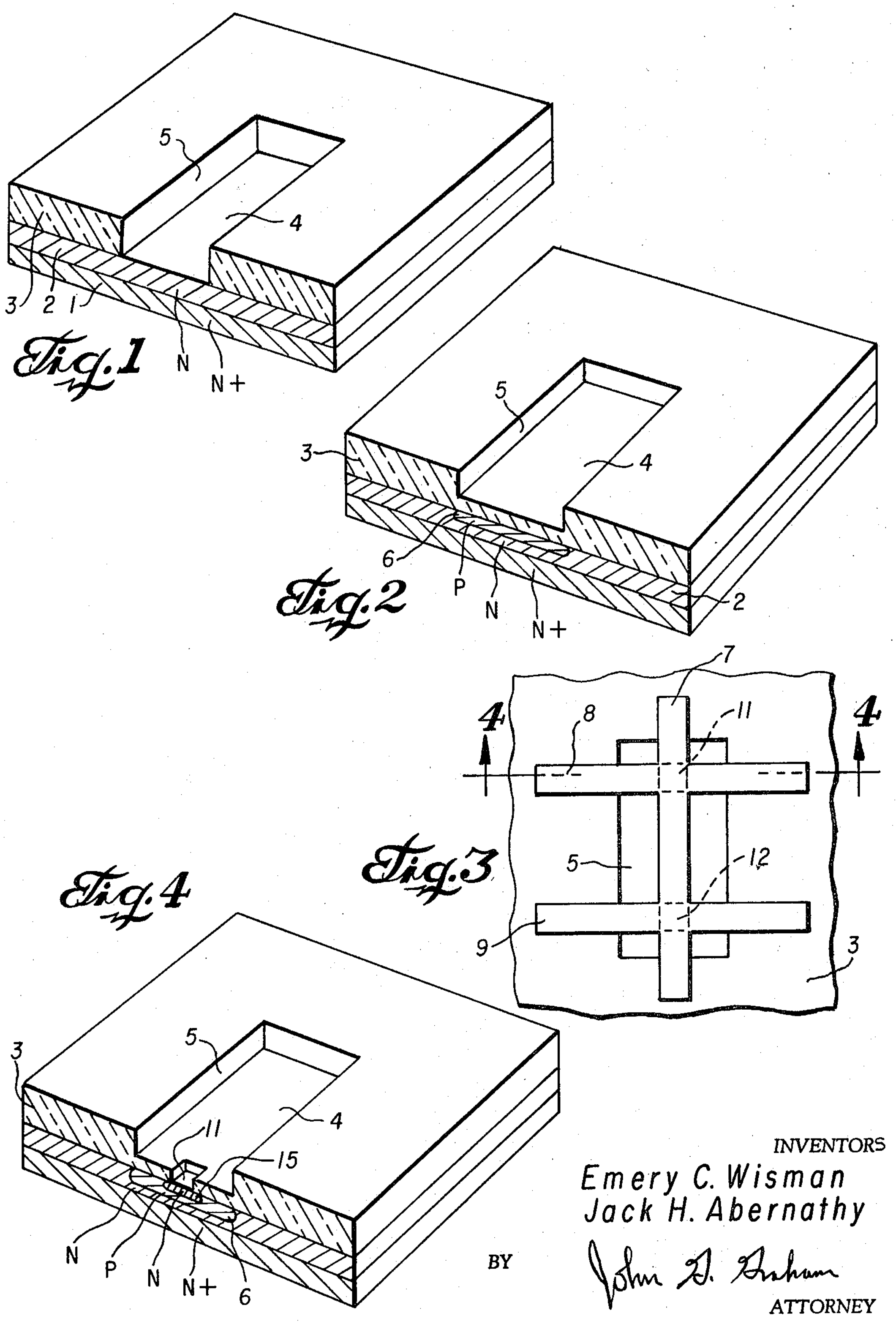
FIGURES 1 and 2 are pictorial views in section of a wafer showing the initial fabrication steps according to this invention.
FIGURE 3 is a plan view of the wafer showing the formation of the small dimensioned apertures.
FIGURE 4 is a pictorial view in section showing the wafer of FIGURES 1 and 2 after diffusion through the small dimensioned aperture.

Referring now to FIGURE 1, there is described the first step in the method of this invention. A body 1 of single crystal low resistivity semiconductor material, such as N+ doped silicon, having a resistivity of perhaps 0.010 to 0.025 Ω/cm. is used as the starting material. Upon this body 1 there is formed a layer 2 of N-type high resistivity semiconductor material, the layer 2 being formed by conventional techniques such as epitaxial deposition. An insulating layer 3 is next formed over the entire surface of the layer 2 using any conventional technique and material. For example the insulating layer 3 could be formed of silicon oxide to a thickness of approximately 8000 A.

After the insulating layer 3 has been deposited, an elongated strip 5 of the layer is selectively removed so as to expose a corresponding area of the surface of the semiconductor layer 2. This removal may be accomplished by first coating the oxide layer 3 with a photoresist material such as one of the Kodak resists designated KMER or ITFR, the former being preferred. Next, a photomask is placed on contact with the surface of the photoresist film so as to mask an area corresponding to the region 5. The masked photoresist is then exposed and developed, resulting in exposing the surface of the oxide layer 3 solely in the elongated area 5. The top of the slice is then subjected to suitable etching fluid such as buffered HF and the portion of the oxide film 3 which is not protected from the etchant by the exposed photoresist is selectively removed to form the elongated slot 5, thereby exposing an area of the N-type layer 2 corresponding approximately to the size of the strip of the oxide removed. The rest of the photoresist material is then stripped from the surface of the oxide layer 3. There is then diffused into the exposed portion of the N-type layer 2 (hereafter referred to as the collector region) within the slot 5 a predetermined amount of acceptor impurity so as to form the P-layer 6 (hereafter referred to as the base region). A thin layer 4 of silicon oxide naturally forms during this diffusion process as shown in FIGURE 2 so as to completely cover the upper surface of the P-type base layer 6 within the elongated slot 5. Intermediate the base region 6 and the collector layer 2 there is provided a junction which serves as the collector-base junction of the transistor device.

Referring now to FIGURES 3 and 4, there is described the next step according to the process of this invention whereby the emitter-base junction or junctions of the transistor are formed to a minimum area. Accordingly, a coat of photoresist is deposited upon the upper surface of the structure shown in FIGURE 2 so as to completely cover the oxide layers 3 and 4. Using the photographic techniques previously described, the entire photoresist layer is exposed except for a thin stripe 7 oriented above the region 5. A series of stripes 8 and 9 are then subsequently formed in the photoresist so as to intersect the originally formed stripe 7 at a 90° angle. These latter stripes 8 and 9 may be formed in the same photoresist layer in which the stripe 7 was formed, or a second layer of photoresist may be applied after the formation of stripe 7, the stripes 8 and 9 being formed in this second layer of photoresist. Application of a suitable etchant to the top surface of the oxide layers will result in the production of small apertures 11 and 12 in the oxide layer 4 corresponding to the intersection of the stripes, the apertures exposing the base region 6. Since the width of the elongated stripes 7, 8 and 9 will normally be as narrow as photographic masking techniques will allow, presently at a value of approximately 0.1 mil, the small apertures 11 and 12 will be of an area of approximately 0.01 sq. mil. FIGURE 4 shows a cross-sectional view of the transistor showing the formation of one of the small apertures 11. Into the aperture 11 there will then be diffused an N-type impurity such as phosphorus resulting in the emitter region 15. As a consequence of this diffusion a thin oxide layer will form over the emitter region 15 within the aperture 11.

Pursuant to the description above, it is to be noted that the width of the elongated slot 5 is greater than the width of the narrow stripe 7. For example, if the slot 7 is formed to a width of 0.1 mil, the width of the stripe 5 may be approximately 0.2 to 0.4 mil. This difference in width will allow the orientation of the stripe 7 within the boundaries defined by the slot 5 by photographic masking techniques without presenting a formidable task of resolution.

As the final steps in the manufacture of the transistor, photographic masking and etching techniques are utilized to expose the emitter, base and collector layers so that ohmic contacts may be deposited upon the exposed areas for the subsequent connection of external leads. The entire upper surface of the transistor structure 20 shown in FIGURE 4 is first subjected to an etchant fluid such as buffered HF. Since the oxide layer above the emitter region is substantially thinner than any of the other oxide layers, it is possible to control the etching steps so as to completely cut through the layer above this region and expose the emitter region 15 without consequently cutting through any of the other layers.

Figure 5:
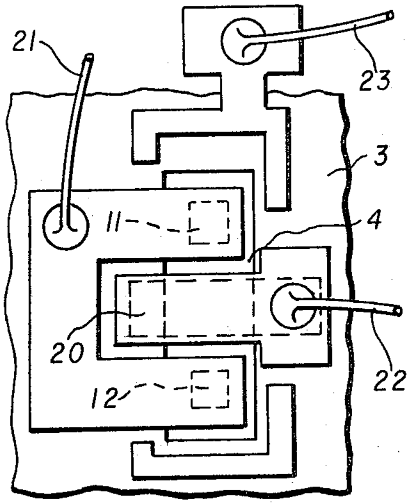
FIGURE 5 is a plan view of the wafer showing the application of the expanded ohmic contacts.

Photomasking and etching are then employed so as to cut through the oxide layers 3 and 4 exposing the collector layer and the base layer respectively. For a particular example, the base exposure is accomplished by placing a layer of photoresist upon the oxide layer 4, masking and exposing a narrow stripe 20 at a position between the emitter holes 11 and 12 as shown in FIGURE 5, and etching the masked stripe in the oxide layer 4 to expose a corresponding portion of the base layer. Expanded ohmic contacts fabricated of aluminum or molybdenum and gold, for example, are then selectively deposited upon the exposed layers, and gold wires are bonded to the ohmic contacts to form the emitter lead 21, the base lead 22 and the collector lead 23 as illustrated in the plan view of FIGURE 5. As an alternative to cutting through the oxide layer 3 to make ohmic contact to the collector region, contact may be made directly to the N+ layer 1 on the backside of the transistor, the layer 1 serving as a low resistance contact region to the collector layer 2. In addition, a series of base contacts may be formed instead of one.

Using the technique just described, a matrix of narrow intersecting elongated stripes such as 7, 8 and 9 may be formed to provide a large number of emitter regions overlying a plurality of base regions, these regions being respectively connected together to provide a transistor device capable of being operated at high frequency, high power and high gain. The emitter-base junctions will be of extremely small area, having been formed by the above-described cross-striped technique within the layer or layers of photoresist.

Figure 6:
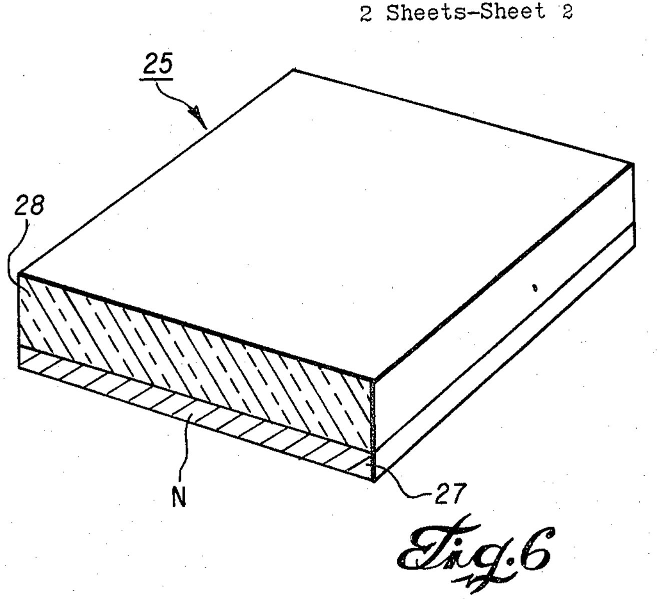
FIGURES 6–9 are additional views of an alternative embodiment showing another use of the present invention.

Considering now the present invention as same relates to small geometry surface-oriented junction transistors, reference is made to FIGURES 6–9 of the drawings. As depicted in FIGURE 6 an oxide layer 28 is formed upon the upper surface of a thin base layer 27 of high resistivity N-type material to a thickness of approximately 8000 A.

Figure 8:
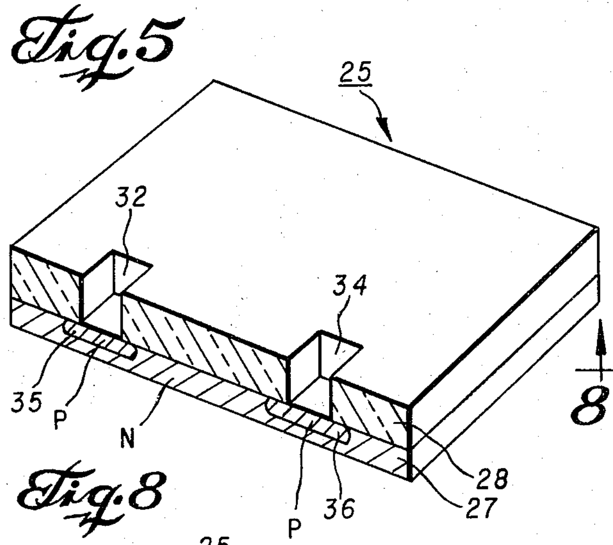
Figure 7:
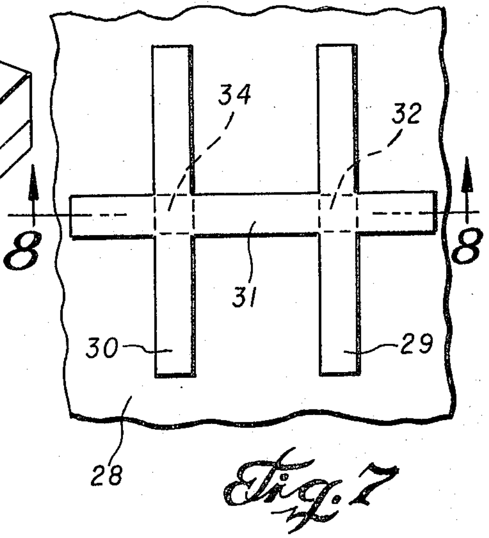
Figure 9:
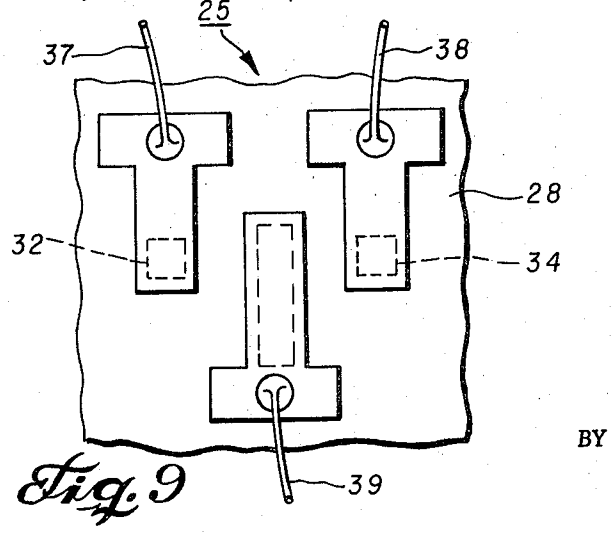

After the oxide layer 28 is formed, a layer of photoresist is placed upon the surface of the oxide layer, and using the same photographic techniques described in the previous embodiment, a long narrow stripe 31 is formed within the photoresist layer as depicted in FIGURE 7. This slot may be as narrow as 0.1 mil in width and approximately 2 mils in length. In like manner the cross stripes 29 and 30 are formed in the layer of photoresist, each stripe also having a width of approximately 0.1 mil and oriented in a manner so as to intersect the originally formed stripe 31 at an angle of 90°. As a result of these photographic techniques, there will be produced at the intersections apertures 32 and 34 within the photoresist, exposing corresponding areas of the oxide layer 28. The exposed areas of the oxide 32 and 34 are then subjected to a fluid etchant, for example buffered HF, whereby the apertures 32 and 34 shown in FIGURE 8 are formed, thereby exposing the base layer 27 within these apertures.

Within the small openings 32 and 34 and upon the exposed surfaces of the N-type base layer 27 within these apertures, there is thereby disposed a quantity of acceptor impurity, as in the form of a silicon-phosphorus alloy, and heat is applied whereby the impurity diffuses into the base layer 27 to form P-type regions 35 and 36, the collector and emitter regions respectively. The unremoved portions of the silicon oxide layer 28 will serve as a mask to limit the lateral diffusion of the donor impurity. As a result of these diffusions, there is provided intermediate the base layer 27 and the collector region 35 a junction which serves as the collector-base junction for the transistor device 25. In like manner there will be provided intermediate the base region 27 and the emitter region 36 a junction which serves as the emitter-base junction for the transistor device 25. Due to the extremely small areas that may be obtained using the cross-striping techniques as described to form the openings 32 and 34, it is possible with the state-of-the-art at its present level to produce very high frequency transistor devices for the junctions having a functioning area of approximately 0.01 sq. mil. During the P-type diffusion there will be consequently formed a thin layer of silicon oxide which completely covers the upper surface of the collector region 35 and the upper surface of the emitter region 36. This oxide layer will be extremely thin, less than 1/16 the thickness of the oxide layer 28.

The thin oxide layer above the collector and emitter region may then be removed by any conventional technique, such as dip etching, the upper surfaces of the collector region 35 and the emitter region 36 thereby being exposed. Subsequently, using a photographic masking and etching process, a portion of the protective oxide layer 28 is selectively removed to expose the upper surface of the base region 27. Aluminum or molybdenum and gold is then deposited upon the exposed emitter, collector and base surfaces and selectively etched so as to form expanded ohmic contacts to allow for external collector lead 37, external emitter lead 38, and external base lead 39 to be attached as illustrated in the plan view of FIGURE 9.

While the invention has been described with reference to specific methods and embodiments, it is to be understood that this description is not to be construed in a limiting sense. For example, although the narrow stripes formed in the photoresist were oriented perpendicular to each other, the resulting apertures formed at their intersection thereby being of a minimum area, the intersection of the stripes at oblique angles will also produce very small apertures which are well defined and free from distortion, thus allowing for small geometry junctions to be fabricated.

Although two types of transistors have been described with reference to particular embodiments, the process described may be utilized to form various other type active semiconductor devices such as diodes, field-effect transistors, etc. Additionally, the above description is equally applicable to NPN configurations as well as PNP configurations.

A so-called negative photoresist has been heretofore described in connection with the process of this invention. When using a negative photoresist, the exposed portion of the material is polymerized and the unexposed portion is removed by development to form the slots through which the oxide is then etched. However, it is to be understood that a positive resist could also be used, in which case the exposed portion is depolymerized and removed by the developing solution. In such a case, the narrow slots in the resist may be exposed by light or by electron beam and the process carried out as previously described.

Various other modifications of the disclosed embodiments as well as other embodiments of the invention may become apparent to a person skilled in the art without departing from the spirit and scope of the invention as defined by the appended claims.

We claim:

1. Method of making a semiconductor transistor comprising the steps of:

(a) forming a first insulating layer adjacent one major face of a semiconductor body of one conductivity type material, (b) selectively removing a first narrow strip of said insulating layer, a first narrow slot thereby being formed within said first insulating layer exposing a corresponding portion of the surface of the body, (c) diffusing into the semiconductor body through the first slot to form a first diffused base region of opposite conductivity type semiconducting material substantially beneath said first slot, (d) reforming a second insulating layer upon the upper surface of said first diffused region and within the first narrow slot, (e) surface coating the second insulating layer with a photographically sensitive material, (f) using a mask having clear and opaque regions to define a second strip region over part of the coated layer, said second strip region being substantially parallel to and within the boundaries defined by said first slot, but of narrower width than the width of said first slot, (g) exposing said coated layer through clear portions of said mask to define etch resistant areas of the coated layer adjacent said second strip region, (h) using a mask having clear and opaque regions to define a third strip region over part of the coated layer, the third strip region intersecting the second strip region, (i) exposing said coated layer through clear portions of said second-mentioned mask to define etch resistant areas of the coated layer adjacent said third strip region, thereby to provide a non-etch resistant area of said coated layer at the intersection of the second and third strip region, (j) etching said non-etch resistant area of said coated layer, thereby to expose a corresponding area upon the surface of the said base region, and (k) diffusing into said base region at said corresponding area to provide an emitter region of one conductivity type material, a small area P-N junction being formed intermediate said base region and said emitter region.

2. A method of fabricating a semiconductor device with a small area junction comprising the steps of:

(a) forming an insulating layer adjacent one major face of a semiconductor body of one conductivity type material, (b) surface coating the layer with a photographically sensitive material, (c) selectively removing a narrow strip of said insulating material, thereby forming a narrow slot within said insulating material exposing a corresponding portion of the surface of the body, (d) diffusing into the semiconductor body through the slot to form a diffused region of opposite type conductivity type then said one conductivity type beneath said slot, (e) forming a second insulating layer upon the upper surface of said diffused region within said narrow slot, (f) surface coating the second insulating layer with a photographically sensitive material, (g) using a mask having clear and opaque regions to define a first strip region over part of the second insulating layer, (h) exposing said coated layer through the clear portions of said mask to define etch resistant areas of the coated layer adjacent to said first strip region, (i) using a mask having clear and opaque regions to define a second strip region over part of the coated layer, the second strip region intersecting the first strip region, (j) exposing said coated layer through clear portions of said second mentioned mask to define etch resistant areas of the coated layer adjacent to the second strip region, thereby to provide a non-etch resistant area of said coated area at the intersection of the first and second stripped regions, (k) etching said non-etch resistant area of said coated layer, thereby to expose a corresponding area upon the surface of said body, and (l) diffusing into said body at said corresponding area to provide a region of opposite type conductivity type material, a P-N junction being formed intermediate to said body and said region of opposite conductivity type material.

3. A method of fabricating a semiconductor device with a small area junction comprising steps of:

(a) forming an oxide layer adjacent one major face of a silicon semiconductor body of one conductivity type material, (b) removing a portion of said oxide layer to form a slot in said oxide layer exposing a strip of said semiconductor body, (c) diffusing a conductivity material into said semiconductor body having a conductivity opposite said one conductivity type, (d) forming an oxide coating over said exposed diffused region, (e) surface coating said oxide layer with a photographically sensitive material, (f) using a mask having clear and opaque regions to define a first strip region over part of the coated oxide layer, (g) exposing said coated oxide layer through clear portions of said mask to define etch resistant areas of the coated oxide layer adjacent to the first strip region, (h) using a mask having clear and opaque regions to define a second strip region over part of the coated oxide layer, the second strip region intersecting the first strip region, (i) exposing said coated oxide layer through clear portions of said second mentioned mask to define etch resistant areas of the coated oxide layer adjacent to said second stripped region, thereby to provide a non-etch resistant area of said coated oxide layer at the intersection of the first and second stripped regions, (j) etching said non-etch resistant area of said coated oxide layer, thereby to expose a corresponding area upon the surface of said body, and (k) diffusing into said body at the corresponding area to provide a region of opposite type conductivity type material, a P-N junction being formed intermediate to said body and said region of opposite conductivity type material.

4. The method as defined by claim 2 wherein said first and second strip regions are of minimum width, and said second strip region intersects the first strip region at a 90° angle.

References Cited

UNITED STATES PATENTS

| | | | |
|---|---|---|---|
| 2,995,473 | 8/1961 | Levi. | |
| 3,144,366 | 8/1964 | Rideout | 148—187 |
| 3,193,418 | 7/1965 | Cooper | 148—187 |
| 3,184,823 | 5/1965 | Little | 148—187 |
| 3,312,577 | 4/1967 | Dunster | 148—187 |
| 3,046,176 | 7/1962 | Bosenberg | 156—17 |

HYLAND BIZOT, *Primary Examiner.*